United States Patent [19]

Oizumi et al.

[11] 4,314,002
[45] Feb. 2, 1982

[54] INSULATING LAMINATES COMPRISING ALTERNATING FIBER REINFORCED RESIN LAYERS AND UNREINFORCED RESIN LAYERS

[75] Inventors: Masayuki Oizumi, Kobe; Masana Goto, Miki; Minoru Ishiki; Shoji Uozumi, both of Kobe, all of Japan

[73] Assignee: Kanegafuchi Kagaku Kogyo Kabushiki Kaisha, Osaka, Japan

[21] Appl. No.: 116,599

[22] Filed: Jan. 29, 1980

[30] Foreign Application Priority Data

Feb. 2, 1979 [JP] Japan .................................. 54-11780

[51] Int. Cl.$^3$ .................. B32B 15/08; B32B 15/12; B32B 15/14; B32B 15/20; B32B 23/08
[52] U.S. Cl. .................................. 428/414; 174/68.5; 428/249; 428/271; 428/272; 428/339; 428/415; 428/431; 428/436; 428/449; 428/458; 428/460; 428/461; 428/463; 428/464; 428/480; 428/481; 428/514; 428/530; 428/531
[58] Field of Search ............... 174/68.5; 428/246, 901, 428/249, 272, 271, 339, 414, 415, 431, 436, 449, 480, 481, 514, 530, 531

[56] References Cited

U.S. PATENT DOCUMENTS

| | | | |
|---|---|---|---|
| 3,558,423 | 1/1971 | Rossetti | 428/901 |
| 3,969,177 | 7/1976 | Doran | 428/433 |
| 4,201,616 | 5/1980 | Chellis et al. | 428/901 |

FOREIGN PATENT DOCUMENTS

| | | |
|---|---|---|
| 2411154 | 8/1974 | Fed. Rep. of Germany . |
| 1367824 | 6/1964 | France . |
| 743900 | 1/1956 | United Kingdom . |
| 816982 | 7/1959 | United Kingdom . |

*Primary Examiner*—James C. Cannon
*Attorney, Agent, or Firm*—Armstrong, Nikaido, Marmelstein & Kubovcik

[57] ABSTRACT

This invention relates to insulating laminates which consists with several sheets of reinforcements (1) inpregnated with curable resin and layers (2) of cured resin located between each reinforcement. Metal clad laminates is also disclosed which is consisting with reinforcement (1), layers (2) of cured resin and metal foil (5) to be placed on the laminates. Each reinforcements (1) are substantially isolated by the resin layers (2).

22 Claims, 4 Drawing Figures

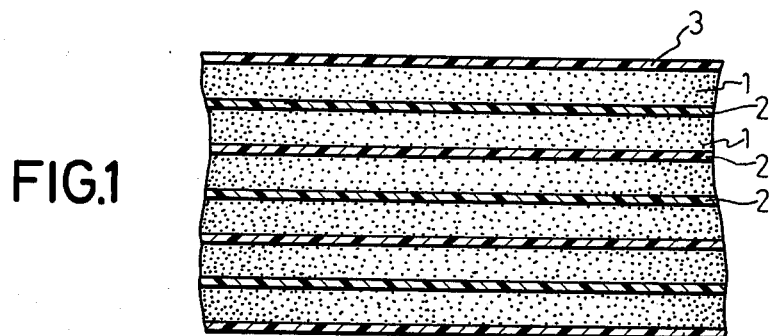
FIG.1
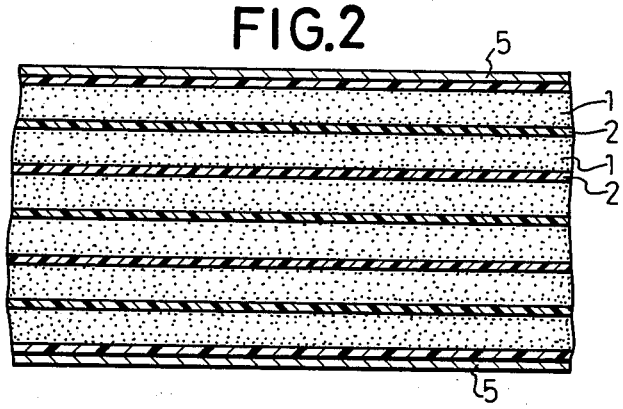
FIG.2
FIG.3 (PRIOR ART)
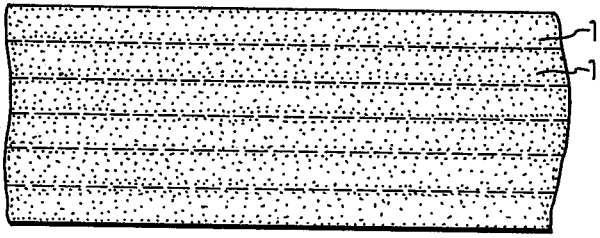
FIG.4 (PRIOR ART)
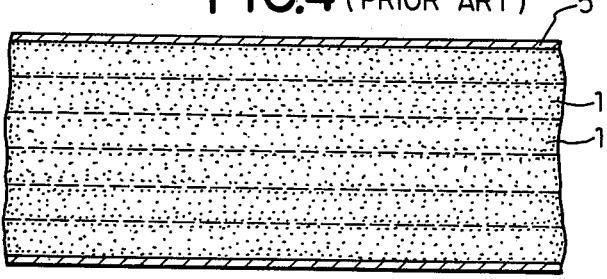

INSULATING LAMINATES COMPRISING ALTERNATING FIBER REINFORCED RESIN LAYERS AND UNREINFORCED RESIN LAYERS

BACKGROUND OF THE INVENTION

The invention of this application relates to insulating laminates for electric use or metal clad laminates for producing electric printed circuit.

'Insulating laminate' in this application means laminate to be used as basic boards or supporting boards to mount electric components or parts, and 'metal clad laminates' means boards for producing electric printed circuits to equip electric components. Conventional laminates are manufactured by impregnating varnish of thermosetting resin into a reinforcement such as phenol resin into paper, epoxy resin into paper or epoxy resin into glass cloth, producing prepregs from the resin impregnated reinforcement, laminating the prepregs or prepregs and metalic foil, for example electroytic copper foil on one or both sides of the laminated prepregs, and hardening them by pressing and heating.

Conventional insulating laminates for electric use, for example, insulating laminates containing phenol resin and paper thus manufactured as described above have a construction as illustrated in FIG. 3. Conventional metal clad laminates also usually have the similar cross section as that of FIG. 4. In the laminates, plural layers of paper impregnated with resin are through precise investigation, not isolated each other because of entanglement of fibers between each of the layers 1. It is well known that electric insulation, heat resistance and stability of dimension of insulating laminates for electric use and metal clad laminates for printed circuit boards are apt to be harmed when the laminates are exposed to moisture or absorb water, rendering unfavorable results for practical use. Usually water soaks into laminates from a surface layer, however, fibers of paper which constructs laminates and boundary area between fiber and resin facilitate soaking water.

Electric insulating resistance in the following two cases are compared in a humid atmosphere, (1) the surface of laminates as shown in FIG. 3 where paper fibers appear on the surface and, (2) the surface of laminates as shown in FIG. 4 where the surface thereof is covered with layer of adhesive for metal foil 5 or layer of the same resin which is impregnating the reinforcement 1. The electric resistance of the former laminates (1) exhibites remarkable decrease in comparison with that of the later laminates (2). The test teaches that fibers of paper contribute to decrease in insulating resistance, that is because of the main reason of water soaking into the surface layer and thence into the boards.

Laminates as shown in FIG. 4 are manufactured by process as disclosed in the Japanese unexamined patent specification SHO.48-31265. Character of the laminates as shown in FIG. 4 in a humid atmosphere is to a certain extent improved, soaking of water is temporarily prevented. However, laminates constructed in this manner do not settle the problem satisfactorily because resin layer is provided only at the surface, and water once passed through the resin layer easily soaks into the laminates. Therefore, once water enters in the surface layer, conventional laminates as illustrated in FIGS. 3 and 4 easily permit water to soak into the inner portion of laminates along continuous fibers extending from the surface to the inner portion of the laminates. Laminates having such construction as that of conventional laminates are apt to absorb moisture and water, which remarkably decreases electric insulation property, especially the ratio of electric volume resistance and the ratio of electric isolating resistance as defined by Japanese industrial standard JIS-C-6418. Absorbed moisture harms heat resistance to endure the heat of solder, and in the case of metal clad insulating laminates for a printed circuit, absorbed moisture in the reinforcement makes the laminates swell, lessens stability of dimension and have caused the laminates to warp.

SUMMARY OF THE INVENTION

The invention of the application has been achieved through intent investigation. The laminates of present invention do not have such construction as the conventional laminates where each reinforcement is laminated directly face by face making a substantially integral body in cross section.

The laminates of this invention have layers of cured resin between each reinforcement 1 to isolate each layer of reinforcement substantially to prevent contact or continuation each other. The object of this application is to disclose insulating laminates for electric use comprising reinforcement impregnated with curable resin and layers of cured resin provided between the said each reinforcements. Another object is to provide metal clad laminates comprising reinforcement impregnated with curable resin, layers of cured resin located between the said each reinforcements and metal foil clad on one or both sides of laminates.

BRIEF DESCRIPTION OF DRAWINGS

FIG. 1 is a sectional view of insulating laminates of the invention.

FIG. 2 is a sectional view of metal clad laminates of the invention.

FIGS. 3 and 4 are sectional views of prior arts, wherein FIG. 3 shows insulating laminates and FIG. 4 shows metal clad laminates.

DETAILED DESCRIPTION OF THE INVENTION

The laminates of the present invention are shown in sectional view in FIG. 1. Several layers of reinforcement 1 impregnated with curable resin such as thermosetting resin are laminated. Between each layer of reinforcement, there is a layer 2 of cured resin which may or may not be the same kind of resin as that which is impregnating in reinforcement 1. The outer surface of reinforcement of extreme side is prepared with surface layers 3 and 4 of cured resin. As each reinforcement 1 is isolated from each other by the layer 2 of cured resin which is located and spread between each reinforcement 1, water or moisture is prevented from soaking deep into reinforcement 1 by the layer 2 of resin which is located between the first and second reinforcement; by the same manner, soaking of water to the inner portion of reinforcement shall be prevented at each layers 2 of resin.

In the laminates of this invention, soaking of water into reinforcement 1 is decreased for the above mentioned reason, and degradation of the character of laminates caused by absorbed moisture and water is considerably improved.

Curable resin impregnating reinforcements 1 and resin of layers 2 formed between each reinforcement 1 are conventional known curable resins such as phenol, epoxy, melamine, silicon or unsaturated polyester, etc. The same kind of resin may be used throughout all layers 2. Resin throughout all layers 2 and resin impregnating in reinforcement 1 may be the same, however it is possible to select different kind of resin at individual layers 2. Reinforcements 1 are made by linter paper or kraft paper containing predominantly cellulose fibers, glass woven cloth, or asbestos woven cloth. Especially paper is recommended for reinforcements for reason of its cheap cost. Because paper is the material which is apt to soak moisture, remarkable improvement in the insulating character of laminates shall be obtained with this invention.

Layers 2 of resin between each reinforcement 1 may be formed by any process however the layer of good quality is obtained by the process which is selected depending upon the kind of resins and reinforcements employed.

For example when phenol resin is used, prepreg is produced first by the well known method, coating resin varnish on its surface, drying the coating, piling up the dried prepregs and curing them by pressing and heating in controlled temperature. Applying excessive pressure at curing process is harmful for forming layers 2 of resin between each reinforcements 1. To overcome this problem, epoxy resin or unsaturated polyestor resin is recommended because they do not need pressure for forming layers of resin. When such resin is used, pressure is controlled not for the purpose of molding laminates but for determining thickness of resin layers between reinforcements 1.

In case when the resin is liquid at room temperature, such as epoxy or unsaturated polyester, laminates are manufactured by applying the resin on each resin impregnated reinforcement at the time the reinforcements are piling up or by impregnating reinforcements with excessive resin and having the reinforcements pass through an opening of a slit device. The opening of the slit is determined by the thickness of reinforcement, number of reinforcements to be piled or the thickness of resin layer located between reinforcements. The reinforcements are piled to form a piled body, and cured by heating. In producing laminates by impregnating reinforcements with thermosetting liquid resin without using solvent, and by curing the laminated reinforcements, it is desirable that no pressure is substantially applied on the laminated reinforcements to mold laminates. The reason why pressure is not substantially added is that the quantity of resin existing between layers of reinforcements can be controlled by having several reinforcements pass through the slit device, and that desired construction of laminates can be obtained because of adding no pressure and curing them as they are. It is well known that thermosetting resin which is impregnated in a reinforcement contracts a little in a reinforcement during curing process. Therefore a small vacant space between layers of reinforcements impregnated with resin happens to be produced because of contraction of resin during curing process under no pressure.

This invention prevents such problem of producing vacant space in laminates and gives favorable result to laminates. It is understood that resinous liquid which exists between layers of reinforcement compensates for contraction of resin in reinforcement during curing process. The resin employed for layers 2 containing no solvent is suitable in carrying out this invention because the resin need not be dried to evaporate solvent and in addition to that, the thickness of resin layer 2 between reinforcements can be controlled without difficulty. Viscosity of uncured liquid resin is also an important factor to control layers 2 of resin located between reinforcements 1. For this reason unsaturated polyester resin is desirable in this invention because uncured unsaturated polyester is in liquid state at room temperature; and unsaturated polyester having wide range of viscosity for example from 0.05 to 15 poise can be easily produced. The thickness of the resin layer 2 is preferablly 1 to 100 μm. Excessive thickness of the layer 2 is apt to harm certain properties of the laminates, for example, punching quality. Therefore the thickness of the resin layer is preferably thinner than the thickness of reinforcement.

The existence and thickness of the resin layer 2 can be examined minutely with an optical microscope by conventional method of shaving a cross section of the laminates with sharp knife, or by setting the test piece with encapsulating resin, then cutting and polishing the section. For the metal clad laminates as shown in FIG. 2, aluminum foil or copper foil are recommended for their high electric conductivity and mechanical strength, especially electrolytic copper foil for its strong adhesion. In this invention it is desirable to provide resin layers not only between each reinforcements but also on one or both sides of laminates as shown in FIG. 1. And for the metal clad laminate, formation of the resin layer as an adhesive surface as shown in FIG. 2 is also recommended.

Complete isolation of reinforcements by the intermediate resin layers 2 is naturally desirable, however the benefit of this invention is preserved even though there are some partial contacts between laminates reinforcement 1. Four Examples of laminates manufactured by different process are compared with conventional laminates.

EXAMPLE 1

Varnish having 48% by weight of solid ingredients is prepared by diluting phenol resin composition by triol, the phenol resin composition containing 100 parts by weight of phenol resin of resol type and 30 parts by weight of China-wood oil. The varnish impregnates in kraft paper cut to proper length having a thickness of 270 μm and weight of 150 g/m². By drying the varnish impregnated kraft paper at a temperature around 150° C., prepregs containing 50% by weight of resin are produced. Further, the varnish is applied again on one of the surfaces of the prepreg and then dried at 150° C. to form a resin layer 25 μm thick. Six sheets of the prepreg having a resin layer on one of its surfaces are piled up and electrolytic copper foil of 35 μm thickness which has an adhesive layer in B-stage of polyvinyl butyral modified by phenol, on the surface thereof, and is obtainable in market, is put on the top of piled prepregs.

By heating them at temperature of 150° C. for 120 minutes and pressing them under pressure of 20 kg/cm², copper clad laminates for a printed circuit board is formed.

The laminate thus obtained by batch process is 1.6 mm thick and has resin layers of 18 μm thick in average between each reinforcements of paper.

COMPARISON TEST 1

Eight sheets of prepreg which are obtained in the same manner of Example 1 are piled up without applying the varnish. Copper foil is put on the top of piled prepregs. The piled materials are heated for 20 minutes at temperature of 150° C., pressed under pressure of 50 kg/cm². Copper clad laminate for printed circuit board is produced. The board is 1.6 mm thick having no substantial resin layer between paper reinforcements.

EXAMPLE 2

Following composition of resin varnish is impregnated in the same kind of papers which are used in Example 1. The papers are dried for 10 minutes at temperature of 130° C. to produce prepreg containing 52% by weight of resin ingredient. The composition is prepared by blending following resins.

Solid epoxy resin 100 parts by weight (product of Tohto Kasei Kabushikikaisha by trademark YD-011) having epoxy molar mass 550 grams, specific weight 1.18 at 20° C., softening point 65° C. being prepared by condensation of epichlorohydrin and bisphenol A

| acetone | 25 parts |
|---|---|
| dicyandiamide | 4 parts |
| dimethylformamide | 15 parts |
| Methyl cellosolve | |
| N, N-dimethyl benzylamin | 0.35 part |
| methyl ethyl ketone | 40 parts |

On both surfaces of the prepregs, a resin layer of 10 μm thickness is formed by coating with the composition. By the process of piling up six sheets of the prepreg having resin layers, curing at temperature of 170° C. for 40 minutes under pressure 10 kg/cm², insulating laminates are obtained. The laminates thus obtained by batch method are 1.6 mm thick having resin layers of 15 μm thick.

COMPARATIVE TEST 2

Seven sheets of prepreg which are obtained in Example 2 are piled up without forming resin layers between reinforcements. By curing at a temperature of 170° C. for 40 minutes under pressure 20 kg/cm², insulating laminates of 1.6 mm thick were produced. Resin layers were not formed between paper reinforcements.

EXAMPLE 3

Following composition of resin which is liquid at room temperature is prepared.

| epoxy resin (product of Shell Chemical Co. by trademark Epikote 828) | 100 parts by weight |
|---|---|
| methyl-tetrahydro phthalic anhydride (product of Hitachi Kasei Kabushikikaisha by trademark HN-2200) | 80 parts |
| dimethylbenzylamine | 0.01 part |

The resin is impregnated into the same kind of paper which is used in Example 1. The resin impregnated paper is placed on aluminum foil of 100 μm thick which is supported horizontally. The same resin is also applied on the paper which is placed on aluminum foil to form a resin layer of 1 mm thick. Another virgin paper is placed on the layer of resin to have the resin impregnating up into the virgin paper. On the said virgin paper, the same resin composition as defined in the above recipe, is again coated. In the same manner placing virgin paper on resin coated paper and coating with resinous liquid on the virgin paper is repeated. Finally a pile of six papers impregnated with resin liquid is produced. After applying resin liquid on the top of the pile and placing aluminum foil of 100 μm thick on it, the pile is forced to pass though a pair of rollers. Clearance between the rollers is adjusted to 1800 μm. By curing the pile in a hot blast of 150° C. for 60 minutes, under low pressure or substantially no pressure, and by removing the aluminum foil thereafter, insulating laminates of 1.6 mm thick are produced. In the laminates thus obtained by batch process, resin layers of about 20 μm thick are detected between reinforcement of paper.

COMPARATIVE TEST 3

Liquid of resin is applied on a paper which is the same kind of paper as used in Example 1 by curtain-flow method so as to leave 50% of resin on the paper. Seven sheets of paper impregnated with resin are piled up and aluminum foils of 100 μm are placed on both sides the pile. The pile is forced to pass through a pair of rollers having clearance of 1800 μm. By performing the same process as that in Example 3, the pile is cured and insulating laminates of 1.6 mm thick are produced. These laminates do not have substantial layers of resin between reinforcements.

EXAMPLE 4

Liquid of resin is prepared by blending 100 parts by weight of commercialized unsaturated polyester resin (product of Takeda Pharmaceutical Co. by trademark Polymal 6304) and one part by weight of Cumene hydro peroxide.

The unsaturated polyester has following property.

| specific weight of liquid | 1.1 |
|---|---|
| viscosity at 25° C. | about 4.5 poise |
| specific weight of solid | 1.2 |
| heat distortion temperature of solid | 90° C. |
| bending strength of solid | 11.2 kg/mm² |
| modulus of bending elasticity of solid | 440 kg/mm² |
| Vical hardness of solid | 45 |

By the same manner as that of Example 3, papers impregnated with resin are piled up and on one of the surfaces of the pile electrolytic copper foil of 35 μm is placed. The pile is forced to pass through a pair of rollers having adjusted clearance of 1730 μm wide, cured in a heat blast first at a temperature of 100° C. for 30 minutes, secondly at 85° C. for 10 hours, and then aluminum foil on one side of pile is removed. The copper clad laminates thus obtained by batch method are about 1.6 mm thick and layers of resin of 20 μm thick are detected between each paper reinforcement.

COMPARATIVE TEST 4

Liquid of resin which is prepared in Example 4 is applied on the paper of the same kind as Example 1 by curtain-flow method to leave 53% of resin impregnating in papers. Seven sheets of paper impregnated with resin are piled up without applying resin liquid between them, and on one side of the pile, aluminum foil of 100 μm thick is placed and on the other side of the pile electrolytic copper foil of 35 μm thick is placed. Then the pile is forced to pass through a pair of rollers having clearance of 1730 μm, and cured in the same manner as Example 4. Copper clad laminates thus obtained are about 1.6 mm thick having no layers of resin between reinforcements.

Comparative table concerning features of each Examples and comparative tests are presented as follows. The test is performed by the method defined in JIS-C-6481. Bracketed passage in the table indicates condition of pretreatment of testing pieces. From the table it is clear that all Examples of the present invention reveals all round favorable feature than that of comparative tests.

|  | Example 1 | Comparative test 1 | Example 2 | Comparative test 2 | Example 3 | Comparative test 3 | Example 4 | Comparative test 4 |
| --- | --- | --- | --- | --- | --- | --- | --- | --- |
| ratio of soaking water (%) | 0.6 | 1.5 | 0.4 | 0.8 | 1.0 | 2.3 | 1.2 | 2.5 |
| ratio of absorbing moisture (%) (C-96/40/95) | 1.8 | 2.5 | 1.3 | 2.8 | 2.2 | 3.5 | 2.3 | 3.8 |
| ratio of mass resistance ($\Omega$-cm) (C-96/23/65) | $6 \times 10^{12}$ | $5 \times 10^{11}$ | $5 \times 10^{13}$ | $2 \times 10^{12}$ | $7 \times 10^{13}$ | $2 \times 10^{13}$ | $9 \times 10^{13}$ | $8 \times 10^{13}$ |
| ratio of mass resistance ($\Omega$-cm) (C-96/40/95) | $5 \times 10^{10}$ | $3 \times 10^{7}$ | $3 \times 10^{11}$ | $2 \times 10^{9}$ | $1 \times 10^{10}$ | $4 \times 10^{8}$ | $8 \times 10^{12}$ | $6 \times 10^{7}$ |
| Heat resistance to solder (Sec) (C-96/23/65) | 20 | 16 | 30 | 26 | 26 | 18 | 30 | 23 |
| Heat resistance to solder (Sec) (C-96/40/95) | 11 | 10 | 13 | 6 | 8 | 2 | 3 | 1 |

We claim:

1. Insulating laminate for electric use consisting essentially of a plurality of cellulosic reinforced layers each fully impregnated with a thermoset resin, and unreinforced layers of a cured resin existing between and extending substantially over the surface of the reinforced layers, wherein said layers of cured resin are substantially integral with the adjacent reinforcements, which are isolated from each other by said layers of cured resin.

2. Insulating laminate as defined in claim 1 wherein an unreinforced layer of resin additionally exists on one side of the laminate.

3. Insulating laminate as defined in claim 1 or 2 wherein the laminate is clad with metal foil on one side of the laminate.

4. Insulating laminate as defined in claim 1 wherein the thermoset resin is cured unsaturated polyester resin.

5. Insulating laminate as defined in claim 1 wherein the thermoset resin is cured epoxy resin.

6. Insulating laminate as defined in claim 1 wherein the cellulosic reinforcements are paper.

7. Insulating laminate as defined in claim 1 wherein each of the layers of cured resin is 1 to 100 $\mu$m thick.

8. Insulating laminate as defined in claim 1 wherein an unreinforced layer of resin additionally exists on both sides of the laminate.

9. Insulating laminate as defined in claim 1 or 2 wherein the laminate is clad with metal foil on both sides of the laminate.

10. Insulating laminate as defined in claim 3 wherein in said cured resin is the same resin as said thermoset resin.

11. Insulating laminate as defined in claim 4 wherein the unsaturated polyester is liquid at room temperature prior to curing.

12. Insulating laminate as defined in claim 5 wherein the epoxy resin is liquid at room temperature prior to curing.

13. Insulating laminate as defined in claim 4 or 5 wherein the laminate is clad with metal foil on one side of the laminate.

14. Insulating laminate as defined in claim 4 or 5 wherein the laminate is clad with metal foil on both sides of the laminate.

15. Insulating laminate as defined in any one of claims 2, 4, 5, 6, 11, 12 or 18 wherein each of the layers of cured resin is 1 to 100 $\mu$m thick.

16. Insulating laminate as defined in any one of claims 1, 2, 4, 5, 6, 7, 11, 12 or 18 wherein said cured resin is the same thermoset resin.

17. Insulating laminate as defined in claim 9 wherein each of the layers of cured resin is 1 to 100 $\mu$m thick.

18. Insulating laminate as defined in claim 13 wherein in each of the layers of cured resin is 1 to 100 $\mu$m thick.

19. Insulating laminate as defined in claim 14 wherein in each of the layers of cured resin is 1 to 100 $\mu$m thick.

20. Insulating laminate as defined in claim 9 wherein in said cured resin is the same resin as said thermoset resin.

21. Insulating laminate as defined in claim 13 wherein in said cured resin is the same resin as said thermoset resin.

22. Insulating laminate as defined in claim 14 wherein in said cured resin is the same resin as said thermoset resin.

* * * * *

UNITED STATES PATENT AND TRADEMARK OFFICE
CERTIFICATE OF CORRECTION

PATENT NO. : 4,314,002
DATED : February 2, 1982
INVENTOR(S) : OIZUMI ET AL

It is certified that error appears in the above-identified patent and that said Letters Patent is hereby corrected as shown below:

Column 3, line 26, "polyestor" should read --polyester--.
Column 8, lines 5, 47, 49, 51, 54 and 57 (line 2 of each of claims 10, 18, 19, 20, 21 and 22), "in" should be deleted at each occurrence; and column 8, lines 39 and 42 (line 2 of each of claims 15 and 16), "18" should read --8--.

Signed and Sealed this

Seventeenth Day of May 1983

[SEAL]

Attest:

DONALD J. QUIGG

Attesting Officer

Acting Commissioner of Patents and Trademarks